United States Patent [19]
Guldi

[11] Patent Number: 5,334,556
[45] Date of Patent: Aug. 2, 1994

[54] METHOD FOR IMPROVING GATE OXIDE INTEGRITY USING LOW TEMPERATURE OXIDATION DURING SOURCE/DRAIN ANNEAL

[75] Inventor: Richard L. Guldi, Dallas, Tex.

[73] Assignee: Texas Instruments Incorporated, Dallas, Tex.

[21] Appl. No.: 35,868

[22] Filed: Mar. 23, 1993

[51] Int. Cl.$^5$ .......................................... H01L 21/324
[52] U.S. Cl. .................................. 437/248; 437/941; 437/949; 148/DIG. 3
[58] Field of Search ................. 437/25, 138, 247, 248, 437/926, 934, 941, 949, 952; 148/DIG. 3, DIG. 21, DIG. 22

[56] References Cited

U.S. PATENT DOCUMENTS

| | | | |
|---|---|---|---|
| 4,833,099 | 5/1989 | Woo | 148/DIG. 3 |
| 5,169,796 | 12/1992 | Murray et al. | 148/DIG. 3 |
| 5,210,056 | 5/1993 | Pong et al. | 437/248 |

FOREIGN PATENT DOCUMENTS

| | | | |
|---|---|---|---|
| 0114121 | 5/1988 | Japan | 437/949 |
| 0119229 | 5/1988 | Japan | 437/949 |
| 0255217 | 10/1989 | Japan | 437/952 |

*Primary Examiner*—Tom Thomas
*Assistant Examiner*—Chandra Chaudhari
*Attorney, Agent, or Firm*—Wade J. Brady; Richard L. Donaldson

[57] ABSTRACT

A method of annealing a partially fabricated semiconductor device which comprises the steps of annealing a partially fabricated semiconductor device in an atmosphere of an inert gas and an oxidizing gas. The inert gas is preferably one of nitrogen and argon and the oxidizing gas is preferably one or more of oxygen, hydrogen chloride and nitrogen trifluoride. The oxidizing gas is from about 1 to about 10% by volume of the atmosphere. The annealing step comprises maintaining the partially fabricated semiconductor device at a first temperature, preferably about 700° C., for a first time period, preferably about 20 minutes, ramping up the temperature at a rate to a second temperature, preferably about 800° C., maintaining the second temperature for a second time period, preferably about 20 minutes, ramping up the temperature at a rate, preferably about 10° C./minute, to a third temperature, preferably about 900° C. maintaining the third temperature for a third time period, preferably about 45 minutes, ramping down the temperature at a rate, preferably about 3° C./minute, to a fourth temperature, preferably about 800° then maintaining the fourth temperature for a fourth time period while maintaining the oxidizing gas in the atmosphere only during at least one of the first time period, the first ramping up, the second time period, the second ramping up, the ramping down or the fourth time period.

26 Claims, 1 Drawing Sheet

METHOD FOR IMPROVING GATE OXIDE INTEGRITY USING LOW TEMPERATURE OXIDATION DURING SOURCE/DRAIN ANNEAL

BACKGROUND OF THE INVENTION

1. Field of the Invention

This invention relates to improvement of gate oxide integrity in CMOS integrated circuits.

2. Brief Description of the Prior Art

Conventional CMOS integrated circuits utilizing clad silicide on moats suffer from potential leakage paths along the sidewall surface of the etched polysilicon gates, a region where the electrical field strength is high due to enhanced electric field lines at the edge of the polysilicon conductor. Many types of semiconductor devices, such as DRAMs and EPROMs minimize this problem by oxidizing the gate polysilicon after the gate etch to form a high quality interface at the edge of the polysilicon. Oxidation of the polysilicon post gate etch could, in principle, be utilized, however there are three drawbacks. First, the enhanced oxidation under the gate edge (smile effect) would reduce drive currents and might even lead to reduced electrical coupling of the gate to the source/drain. Second, the enhanced oxidation rate of heavily doped polysilicon compared to lightly doped moats leads to thicker oxide on the polysilicon that is more difficult to remove before silicide formation. Third, high temperature oxidation of polysilicon can lead to enhanced diffusion of electrical dopants in p-n junctions of bipolar transistors which result in unacceptable electrical performance.

A second gate oxide integrity related problem can be caused by electrical leakage from the gate electrode 11 to the silicon 3 along a path between sidewall oxide 4 and gate oxide 6 and then by leakage to silicon along the edge where gate oxide is etched during sidewall oxide overetch 5, as shown in FIG. 1.

A third gate oxide integrity problem arises because of damage to the gate oxide in the region 6 adjacent to the gate 11, caused by the reachthrough implant, which is implanted into regions 15 of FIG. 1 before the sidewall oxide 4 is formed.

A protection technique which has been used is formation of a sidewall oxide wherein an oxide is deposited over the entire moat, the oxide then being etched back isotropically to leave oxide on the sidewalls of the polysilicon. This technique has helped but does not completely satisfy the problem set forth above. A further protection technique has involved oxidation of the polysilicon gate material. This type of oxide is thermal and is better than the deposited oxide in that it makes a cleaner, higher quality seal with the polysilicon with fewer electrically conducting oxide charges. In each case, with the sidewall oxide in place, titanium is then deposited over the entire surface and reacted with the exposed silicon to form titanium silicide, generally over the source/drain regions and the polysilicon gate, but not over the oxide. However, it is necessary to remove all oxide layers over the gate or over the silicon except for the sidewall oxide to form the silicide and this requires extra costly processing steps.

SUMMARY OF THE INVENTION

In accordance with the present invention, there is provided a simple method for sealing the gate edge and sidewall oxide region to improve gate oxide integrity, namely the addition of oxygen during the low temperature portion of the source/drain anneal. The invention is easily inserted into existing process flows without adding additional processing steps and it avoids the pitfalls of oxidizing polysilicon.

Initially, within the moat or active region, there is formed a gate oxide with the polysilicon gate over a portion of the gate oxide and a sidewall oxide on the sidewalls of the polysilicon gate in standard manner. A reachthrough implant is performed in P-wells prior to sidewall oxide deposition. The source/drain implants are then provided in standard manner to form regions for contacting the channel beneath the gate region. The source/drain anneal then takes place.

Typical conventional source/drain anneals can be accomplished using temperatures from about 850° to about 1000° C. for about 20 to about 60 minutes in an inert atmosphere, such as nitrogen or argon ambient. The anneal according to the present invention follows a time-temperature curve starting at about 600° to 800° C. in an inert, preferably nitrogen or argon ambient for about 30 to 60 minutes, then ramping up the temperature at about 10° C. per minute in an inert ambient to about 850° to 1000° C. and maintaining that annealing temperature for about 20 to about 60 minutes and then ramping down the temperature at about 3° C. per minute (this may be furnace limited) in an inert ambient to about 750° to 850° C. before removing the wafers from the furnace. The ambient may vary somewhat as may the times and temperatures from process to process. The anneal permits the dopant species to attach to lattice sites and become electrically active and act as a donor or acceptor.

A key to the present invention is to add to the ambient from about 1% to about 10% oxygen by volume, this causing a slight oxidation at the edges of the polysilicon. Oxidation at this stage of processing benefits CMOS devices by sealing various leakage paths such as near the edge of the polysilicon, between sidewall oxide and unetched gate oxide and at the edge where the gate oxide is etched during sidewall spacer overetch. Oxidation is also beneficial for repairing damage to the gate oxide in region 6 of FIG. 1 caused by the reachthrough implant.

Improved results have been obtained when adding oxygen only during the period prior to the first ramp up of temperature for about 30 minutes or only during the ramp up where the ramp up began immediately and there was essentially no heating period prior to the initial ramp up. The period prior to ramp up is preferably as short as possible or non-existent where adequate results can be obtained by using the oxygen during ramp up only since this period adds to processing time.

However, improved results have also been obtained by adding oxygen as above described prior to ramp up as well as during all of or a portion of the ramp up and/or ramp down or even after the ramp down. It is generally undesirable to add oxygen during the high temperature portion of the annealing process because oxygen causes interstitials of silicon (a silicon atom not on a lattice site) and that causes dopants to diffuse too deep into the silicon whereby the deep junctions compromise electrical performance. It would appear that, as devices become smaller, the time period of oxygen utilization will decrease.

In addition to the oxygen, from about 0.01% to about 10% HCl, $NF_3$ or $F_2$ can be added to the ambient.

DESCRIPTION OF THE PREFERRED EMBODIMENT

Figure 1:
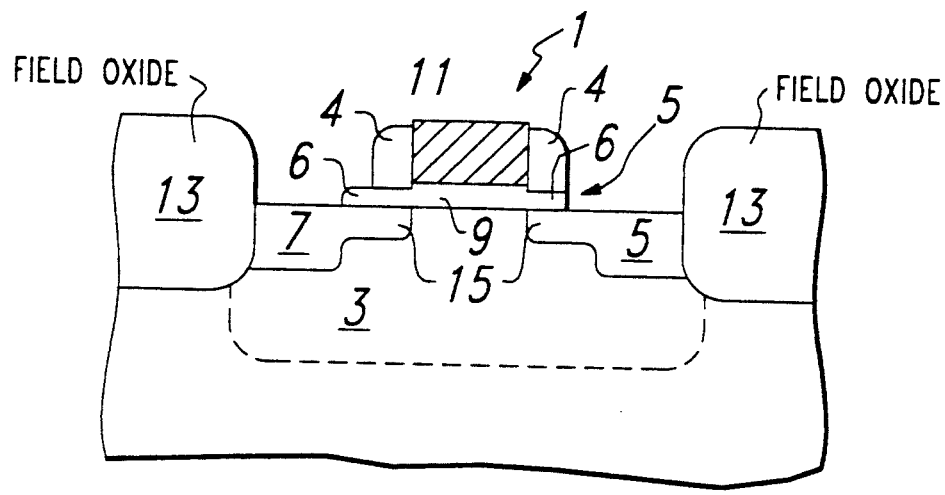
FIG. 1 is a diagram of a typical MOS device in accordance with the prior art.

With reference to FIG. 1, there is shown a schematic diagram of a standard MOS device 1 having an active region 3 of P or N type semiconductor material, N or P type source/drain regions 5 and 7, a gate oxide 9, a polysilicon gate electrode 11 and field oxide 13 defining the active region containing the device 1. Any electric charge that builds up in the polysilicon can discharge along the edge of the gate oxide 9 since the gate oxide is generally thinner to the side of the polysilicon than it is under the polysilicon as a result of the polysilicon etch. The breakdown generally occurs at the position of the gate oxide near the edge of the polysilicon sidewall since that electric field is highest at that location and is caused by a rupture in the gate oxide at that location due to excessive electrical current flow. This particular region of silicon oxide is also sensitive to electrical breakdown because of the presence of structural damage caused by the reachthrough implant.

In order to fabricate an MOS device in accordance with the present invention, the moat region for fabrication of a device is delineated by the formation of the field oxide 13 as shown in FIG. 1. Then the gate oxide 9 and polysilicon gate 11 are formed in the moat region. A reachthrough implant, typically phosphorus, is implanted into p-wells to provide conducting regions 15. A sidewall spacer 4 is formed by depositing an insulating film such as silicon oxide over the gate electrode and anisotropically etching the film to leave the sidewall spacer. Source and drain implants are then performed with the gate 11 and sidewall spacer 4 acting as a mask to form the source and drain regions 5 and 7 in standard manner. The structure of FIG. 1 is then annealed, with or without a sidewall oxide on the sidewalls of the polysilicon gate 11.

Figure 2:
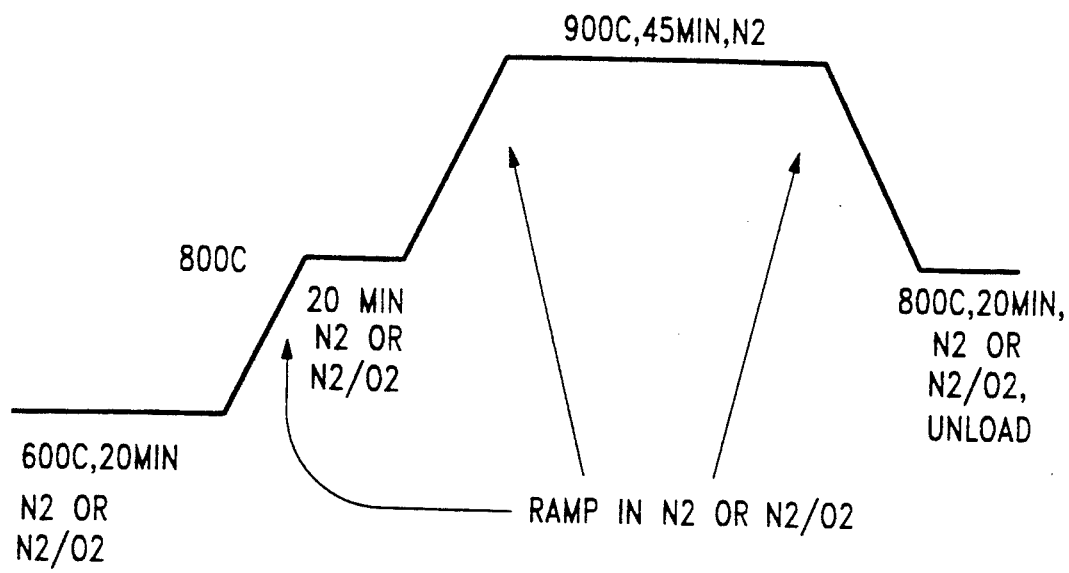
FIG. 2 is an oxidation schedule for source/drain anneal with oxygen in accordance with the present invention.

The annealing process is shown with reference to FIG. 2. The structure of FIG. 1 is placed in a chamber having a nitrogen ambient with 1 to 10% by volume oxygen at 600° C. for 20 minutes. The temperature is then ramped up to 800° C. at a rate of about 10° C./minute in a nitrogen ambient. After the temperature reaches 800° C. during ramp up, the furnace is held at 800° C. for 20 minutes with nitrogen or nitrogen plus 1 to 10 percent by volume oxygen. Then the temperature is ramped up further to 900° C. in nitrogen or nitrogen plus 1 to 10 percent by volume oxygen and maintained at 900° C. in nitrogen for 45 minutes. The temperature is then ramped down to 800° C. at a rate of about 3° C./minute in a nitrogen atmosphere and then the wafers are removed from the furnace. After reaching 800° C., the furnace is maintained at 800° C. for 20 minutes in nitrogen plus 1 to 10 percent by volume oxygen. Processing then proceeds in standard manner with the addition of insulators, metallization and other appropriate overlayers.

In accordance with a second embodiment of the invention, wherein a device with gate length of 0.8 to 1.2 microns is being fabricated, the annealing process begins with the initial ramp up at 10° C./minute in a chamber having a nitrogen ambient with 1 to 10% by volume oxygen. The remaining fabrication proceeds in accordance with the first embodiment described above.

In accordance with a third embodiment of the invention, processing took place as in the first embodiment above with the oxygen also being retained in the chamber as in the second embodiment.

In accordance with a fourth embodiment of the invention, processing can take place as in the first embodiment with the oxygen as noted above being added during the temperature ramp down as well.

In accordance with a fifth embodiment of the invention, processing can take place as in the first embodiment with the oxygen as noted above being added during the ramp up and ramp down as well.

In accordance with a sixth embodiment of the invention, processing can take place with the addition of oxygen only during the ramp up and ramp down.

In accordance with a seventh embodiment of the invention, processing can take place with the addition of oxygen only during the ramp down.

In general, in all of the above described embodiments, the time period wherein the oxygen is added to the ambient will vary in accordance with the size of the device being fabricated.

Though the invention has been described with respect to specific preferred embodiments thereof, many variations and modifications will become apparent to those skilled in the art. It is therefore the intention that the appended claims be interpreted as broadly as possible in view of the prior art to include all such variations and modifications.

I claim:

1. A method of improving gate oxide integrity of a partially fabricated semiconductor device, comprising the steps of:
   (a) providing a partially fabricated semiconductor device by the steps of:
      (i) providing a semiconductor substrate having a moat region delineated by a field oxide;
      (ii) forming a gate oxide in said moat region;
      (iii) forming a polysilicon gate over said gate oxide layer; and
      (iv) forming spaced apart source and drain regions adjacent said polysilicon gate; and
   (b) annealing said partially fabricated semiconductor device in an atmosphere of an inert gas and an oxidizing gas at a temperature commencing from about 600° C. and gradually ramped up to about 900° C.; and
   (c) further annealing said partially fabricated semiconductor device in an atmosphere of an inert gas when reaching said temperature of about 900° C.

2. The method of claim 1 wherein said inert gas is taken from the group consisting of nitrogen, argon or a combination thereof.

3. The method of claim 1 wherein said oxidizing gas is oxygen, further including adding to the ambient from about 0.01% to about 10% nitrogen trifluoride, fluorine or hydrogen chloride.

4. The method of claim 1 wherein said oxidizing gas is oxygen, further including adding to the ambient from about 0.01% to about 10% nitrogen trifluoride, fluorine or hydrogen chloride.

5. The method of claim 1 wherein said oxidizing gas is from about 1 to about 10% by volume of said atmosphere.

6. The method of claim 2 wherein said oxidizing gas is from about 1 to about 10% by volume of said atmosphere.

7. The method of claim 3 wherein said oxidizing gas is from about 1 to about 10% by volume of said atmosphere.

8. The method of claim 4 wherein said oxidizing gas is from about 1 to about 10% by volume of said atmosphere.

9. The method of claim 1 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

10. The method of claim 2 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

11. The method of claim 3 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

12. The method of claim 4 wherein said step of annealing comprises the steps of maintaining said partially fabricated semiconductor device at a first temperature for a firsts time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

13. The method of claim 5 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

14. The method of claim 6 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

15. The method of claim 7 wherein said step of annealing comprises the steps of maintaining said partially fabricated semiconductor device at a first temperature for a first time period, ramping up said temperature at a rate to a second temperature, maintaining said second temperature for a second time period, ramping up said temperature at a rate to a third temperature, maintaining said third temperature for a third time period, ramping down said temperature at a rate and then maintaining said temperature for a fourth time period while maintaining said oxidizing gas in said atmosphere only during at least one of said first time period, said second time period, said fourth time period, said ramping up or said ramping down.

16. The method of claim 9 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

17. The method of claim 10 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

18. The method of claim 11 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

19. The method of claim 12 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

20. The method of claim 13 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

21. The method of claim 14 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

22. The method of claim 15 wherein said first temperature is about 600° C., said first time period is about 30 minutes, said ramping up said temperature is at a rate of about 10° C./minute, said second temperature is about 800° C., said second time period is about 45 minutes, said third temperature is about 900° C., said third time period is about 20 minutes, said ramping down said temperature is at a rate of about 3° C./minute, said final anneal temperature is about 800° C. and said time period is about 20 minutes.

23. The method of claim 1 further including the step of forming a sidewall spacer on the sidewalls of said polysilicon gate prior to annealing.

24. The method of claim 4 further including the step of forming a sidewall spacer on the sidewalls of said polysilicon gate prior to annealing.

25. The method of claim 2 further including the step of forming a sidewall spacer on the sidewalls of said polysilicon gate prior to annealing.

26. The method of claim 22 further including the step of forming a sidewall spacer on the sidewalls of said polysilicon gate prior to annealing.

* * * * *